United States Patent [19]

Mizutani

[11] Patent Number: 5,444,730
[45] Date of Patent: Aug. 22, 1995

[54] SINGLE-WAVELENGTH SEMICONDUCTOR LASER

[75] Inventor: Natsuhiko Mizutani, Yokohama, Japan

[73] Assignee: Canon Kabushiki Kaisha, Tokyo, Japan

[21] Appl. No.: 262,464

[22] Filed: Jun. 20, 1994

[30] Foreign Application Priority Data

Jun. 28, 1993 [JP] Japan .................................. 5-181873

[51] Int. Cl.6 .............................................. H01S 3/085
[52] U.S. Cl. ........................................ 372/45; 372/19; 372/50
[58] Field of Search ................. 372/45, 50, 19; 385/40

[56] References Cited

U.S. PATENT DOCUMENTS

| 4,488,307 | 12/1984 | Rarmire et al. | 372/50 |
| 5,220,573 | 6/1993 | Sakata et al. | 372/50 |
| 5,253,314 | 10/1993 | Alferness et al. | 385/40 |
| 5,349,598 | 9/1994 | Ouchi et al. | 372/50 |

FOREIGN PATENT DOCUMENTS

| 345923 | 12/1989 | European Pat. Off. |
| 62-89388 | 4/1987 | Japan . |
| 2-126693 | 5/1990 | Japan . |
| 3-184388 | 8/1991 | Japan . |

OTHER PUBLICATIONS

Roy Lang and Kohroh Kobayashi, "External Optical Feedback Effects on Semiconductor Injection Laser Properties", I.E.E.E. Journal of Quantum Electronics, vol. OE–16, No. 3, Mar. 1980, pp. 347–355.

T. L. Koch, et al., "Vertically Grating–Coupled Arrow Structures for III–V Integrated Optics", IEEE Journal of Quantum Electronics, QE–23, Jun. 1987, No. 6, pp. 889–897.

M. C. Amann, et al., "Widely Tunable Distributed Forward Coupled (DFC) Laser ", Electronics Letters, vol. 29, No. 9, Apr. 1993, pp. 793–794.

Y. Suematsu, et al. "Axial–Mode Selectivities for Various Types of Integrated Twin–Guide Lasers", IEEE Journal of Quantum Electronics, Vol. QE–13, No. 8, Aug. 1977, pp. 619–622.

T. L. Koch, et al., "Wavelength selective interlayer directionally grating–coupled InP/InGaAsP waveguide photodetection ", Applied Physics Letters, vol. 14, No. 5, Oct. 1987, pp. 1060–1062.

Primary Examiner—Rodney B. Bovernick
Assistant Examiner—Yisun Song
Attorney, Agent, or Firm—Fitzpatrick, Cella, Harper & Scinto

[57] ABSTRACT

A single wavelength semiconductor laser comprises a laser cavity portion and a mode selector portion. The laser cavity portion includes a waveguide and perturbation means for imparting a periodical perturbation to the waveguide. The laser cavity portion functions as a mode selecting reflective mirror for coupling two modes, which have different absolute values of propagation constants, to each other, accompanied with a mode conversion. The two coupled modes respectively travel forward and rearward along the waveguide to constitute two degenerate laser resonance modes. The mode selector portion selectively outputs a predetermined laser resonance mode out of the two degenerate laser resonance modes, and the mode selector portion is structured so that light returning to the semiconductor laser from outside can be coupled only to the other of the two degenerate laser resonance modes. Thus, a dynamic single wavelength semiconductor laser is obtained, which is insensitive to returning light, even without use of any isolator.

20 Claims, 5 Drawing Sheets

EVEN MODE   ODD MODE   EVEN MODE

FIG.2B

ODD MODE   EVEN MODE

$E_{10}{}^x$ MODE

FIG. 6B $E_{00}{}^x$ MODE

FIG. 7

SINGLE-WAVELENGTH SEMICONDUCTOR LASER

BACKGROUND OF THE INVENTION

1. Field of the Invention

The present invention relates to a single-wavelength semiconductor laser that is applicable to optical communications, optical exchanges, optical recordings, optical operations, optical measurements and the like.

2. Description of Related Background Art

Conventionally, a Fabry-Perot type of semiconductor laser, which uses its cleaved facets as a cavity, has been known. This type of laser has a cavity whose length is several hundred to several thousand times as large as the oscillation wavelength, and has multiple resonance or longitudinal modes in the vicinity of the laser's gain peak. Therefore, the laser is likely to oscillate in a multimode fashion, and such multimode oscillation is particularly prominent during high-speed modulation driving. Multimode oscillation becomes a serious problem when that type of laser is used in fiber optical communications, because of the wavelength dispersion of the optical fiber. Hence, a dynamic single-mode semiconductor laser, which performs single wavelength operation even during high-speed modulation driving, has been earnestly studied and developed.

As a dynamic single-mode semiconductor laser, there have been proposed distributed feedback (DFB) and distributed Bragg reflector (DBR) lasers which introduce a distributed reflector of a grating into the cavity of the laser and utilize its wavelength selectivity in order to selectively reduce the resonator loss of only one resonance mode. However, when a part of the output light beam is reflected and returns to the laser cavity of that dynamic single-mode laser, the laser characteristic will greatly fluctuate even if the amount of the returning light is small. The fluctuation due to the returning light appears as fluctuations of light output power, oscillation mode and oscillation spectral width, with respect to static characteristics. As dynamic characteristics, for example, the intensity noise due to mode-hopping between axial or longitudinal modes of an external resonator increases and the response characteristic during the modulation driving due to the quantum noise varies, because of the returning light.

The operation of the semiconductor laser under the influence of the returning light can be described by using a coupled cavity model. In this model, it is assumed that the multi-reflection at the external resonator is disregarded, and light emitted through the end facet of the laser is reflected by the external reflection plane to be returned to the laser and optically couples to the laser cavity at the emission facet to form the coupled cavity. The operation of the coupled cavity laser can be described by the following generalized van der Pol equation (see Roy Lang and Kohzoh Kobayashi, "External Optical Feedback Effects on Semiconductor Injection Laser Properties", IEEE J. Quantum Electron., vol. QE-16, pp. 347–355, Mar. 1980):

$$dE(t)/dt = \{i(\omega(n) - \Omega) + \tfrac{1}{2}(G(n) - \Gamma)\}E(t) + \kappa_{ext}E(t-\tau)\exp(-i\Omega\tau) \quad (1)$$

$$dn/dt = -\gamma n - G(n)|E(t)|^2 + P \quad (2)$$

where $\Omega$ is the oscillation frequency, $\omega$ is one resonance frequency of the laser cavity, G is the mode gain, $\gamma$ is the reciprocal of the carrier lifetime due to spontaneous combination, $\kappa$ is the resonator loss and P is the injection number of carriers per unit volume and unit time, which is proportional to the injected current. In relation (1), the second term represents the contribution of the returning light beam, $\tau$ is the reciprocal time of light in the external resonator and $\kappa_{ext}$ is the parameter that indicates the coupling intensity between the resonators and is defined by the following relation:

$$\kappa_{ext} = (1-R_2)\cdot(R_3/R_2)^{\frac{1}{2}}\cdot c/2\eta L_d \quad (3)$$

where $R_3$ and $R_2$ are respectively reflection coefficients of the external reflective mirror and the laser facet facing the external reflective mirror, and $L_d$ and $\eta$ are respectively the laser cavity length and the active region refractive index. The value of $\kappa_{ext}$ is the amount that can be obtained when light returning into the laser cavity from the end facet of the laser cavity is represented by the combination of light reflected by the end facet and light reflected by the external reflective surface and returning to the laser cavity. In a semiconductor laser, the value of $\kappa_{ext}$ will increase, and thus the influence of the returning light is likely to appear even when a small external reflection occurs. Specifically, the relative intensity of noise (RIN) increases when the returning light amounts to more than 0.01%. It is known that the increase in RIN is caused by the mode hopping between axial modes of the external resonator (see "Fundamentals of Semiconductor Laser", edited by Japan Academy of Applied Physics, pp. 102–105, published by Ohm Inc., 1987).

Thus, the laser characteristic of a dynamic single mode laser is likely to be subjected to a large fluctuation by the returning light since the returning light is coupled, as the external resonator mode, to the oscillation mode of the laser. As a result, stabilization of light output and suppression of the intensity noise are insufficient if effected only by the establishment of a single mode in the laser cavity. Therefore, when the laser is used as a light source in fiber optical communication systems, the use of an optical isolator is indispensable.

As discussed in the foregoing, a conventional single mode laser is unstable for returning light, and hence the isolator needs to be used. Therefore, coupling loss due to the insertion of the isolator occurs, the size of the device increases, and the cost of an entire apparatus rises.

SUMMARY OF THE INVENTION

It is an object of the present invention to overcome the problems of the prior art.

It is an object of the present invention to provide a dynamic single wavelength semiconductor laser that is stable or sufficiently insensitive to returning light without using any isolator.

According to one aspect of the present invention which achieves these objectives, a single wavelength semiconductor laser comprises a laser cavity portion and a mode selector portion. The laser cavity portion includes a waveguide and perturbation means for imparting a periodical perturbation to the waveguide. The laser cavity portion functions as a mode selecting reflective mirror for coupling two modes, which have different absolute values of propagation constants, to each other, accompanied with a mode conversion. The two coupled modes respectively travel forward and rearward along the waveguide to constitute two degenerate laser resonance modes. The mode selector portion selectively outputs a predetermined laser resonance mode out of the two degenerate laser resonance modes, and the mode selector portion is structured so that light returning to the semiconductor laser from outside can be coupled only to the other of the two degenerate laser resonance modes.

According to another aspect of the present invention which achieves these objectives, a single wavelength semiconductor laser comprises a laser cavity portion and a mode selector portion. The laser cavity portion includes a multimode waveguide through which a plurality of transverse modes having different absolute values of propagation constants can be propagated, and means for imparting a periodical perturbation to the waveguide, so that the transverse modes can be coupled to each other when light of a predetermined wavelength is propagated in the waveguide. The two coupled transverse modes travel forward and rearward along the waveguide to constitute two degenerate laser resonance modes. The mode selector portion selectively outputs a predetermined laser resonance mode out of the two degenerate laser resonance modes The mode selector portion is structured so that light returning to the semiconductor laser from outside can be coupled only to the other of the two degenerate laser resonance modes.

According to another aspect of the present invention which achieves these objectives, a single wavelength semiconductor laser comprises a laser cavity portion and a mode selector portion. The laser cavity portion includes a waveguide, and means for imparting a periodical perturbation to the waveguide so that transverse electric (TE) and transverse magnetic (TM) modes having different absolute values of propagation constants can be coupled to each other, accompanied with a mode conversion, when light of a predetermined wavelength is propagated in the waveguide. The coupled TE and TM modes travel forward and rearward to constitute two degenerate laser resonance modes. The mode selector portion selectively outputs a predetermined laser resonance mode out of the two degenerate laser resonance modes. The mode selector portion is structured so that light returning to the semiconductor laser from outside can be coupled only to the other of the two degenerate laser resonance modes.

According to another aspect of the present invention which achieves these objectives, a single wavelength semiconductor laser comprises a laser cavity portion and a mode selector portion. The laser cavity portion includes a waveguide and means for imparting a perturbation to the waveguide, so that two kinds of modes having different absolute values of propagation constants can be coupled to each other when light of a predetermined wavelength is propagated in the waveguide. The coupled modes respectively travel in opposite directions to constitute two degenerate laser resonance modes. The mode selector portion selectively outputs a predetermined laser resonance mode out of the two degenerate laser resonance modes. The mode selector portion is structured so that light returning to the semiconductor laser from outside can be coupled only to the other of the two degenerate laser resonance modes.

According to another aspect of the present invention which achieves these objectives, a single wavelength semiconductor laser comprises a laser cavity portion and a mode selector portion. The laser cavity portion includes a waveguide and means for imparting a perturbation to the waveguide, so that first and second modes having different absolute values of propagation constants can be coupled to each other when light of a predetermined wavelength is propagated in the waveguide. The coupled first and second modes respectively travel in opposite first and second directions to constitute first and second laser resonance modes. The first laser resonance mode consists of the first mode travelling in the first direction and the second mode travelling in the second direction, and second laser resonance mode consists of the first mode travelling in the second direction and the second mode travelling in the first direction. The mode selector portion selectively outputs the first mode travelling in the first direction, and the mode selector portion is structured so that light returning to the semiconductor laser from outside can be coupled only to the the first mode travelling in the second direction.

More specifically, the laser cavity portion includes loss means for suppressing the mode conversion in which the absolute value of the propagation constant remains unchanged and the sign thereof is inverted. The loss means comprises an absorptive region provided adjacent to or in the laser cavity portion. The loss means comprises an antireflection coating provided on an end face of the laser. The loss means comprises an end face of the laser formed slantingly relative to a direction perpendicular to the waveguide. Two waveguides are arranged to constitute an asymmetrical directional coupler, and the two modes are even and odd modes which are propagated through the asymmetrical directional coupler. The mode selector portion comprises separator means for spatially separating the two laser resonance modes and taking out one of the two laser resonance modes.

More specifically, the mode selector portion comprises a waveguide which is connected to and extends from one of the two waveguides of the asymmetrical directional coupler. The waveguide comprises a multimode waveguide and the two modes are 0-th order transverse mode and first-order transverse mode which are propagated through the multimode waveguide. The mode selector portion comprise a single mode waveguide having a predetermined cutoff. The two modes are transverse electric (TE) and transverse magnetic (TM) modes whose principal directions of electric fields are different from each other. The mode selector portion comprises selective loss means for selectively imparting loss to one of the TE and TM modes. The mode selector portion comprises a metal film. The laser cavity portion comprises a magnetic semiconductor layer formed along the waveguide. The perturbation means comprises a grating formed along the waveguide. The mode selector portion includes an electrode for injecting current into the mode selector means.

Further, the perturbation means may comprise a fine grating which gives birth to a periodical modulation due to a real or imaginary of the complex refractive index. However, in order to cause the mode coupling accompanied with the mode conversion, the grating has to be a relief-shaped grating, rather than a periodical modulation of the refractive index in which the refractive index is uniform in a plane perpendicular to a waveguide extending direction.

Furthermore, the perturbation means may be a periodical modulation of a dielectric constant or an equivalent refractive index which causes the mode coupling accompanied with the mode conversion to a waveguide, wherein propagation constants of the TE and TM modes can be made to differ from each other considerably by using a quantum well structure, due to the presence of a non-zero component in non-diagonal elements of a relative dielectric constant tensor.

In the above-described semiconductor laser according to the present invention, oscillation is effected in two degenerate oscillation or resonance modes, and one of the oscillation modes is selected as an output. Returning light to the laser can only be coupled to the other oscillation mode, which is not the output oscillation mode, so that the influence of the returning light on this laser is small, as compared with a conventional semiconductor laser. Furthermore, this laser can operate as a single wavelength laser because the mode coupling due to the periodical perturbation has a sharp wavelength selectivity.

These and other objects, features, and advantages of the present invention will become more apparent upon consideration of the following detailed description of the preferred embodiments when read in conjunction with the attached drawings.

DESCRIPTION OF THE PERFERRED EMBODIMENTS

First Embodiment

Figure 1:
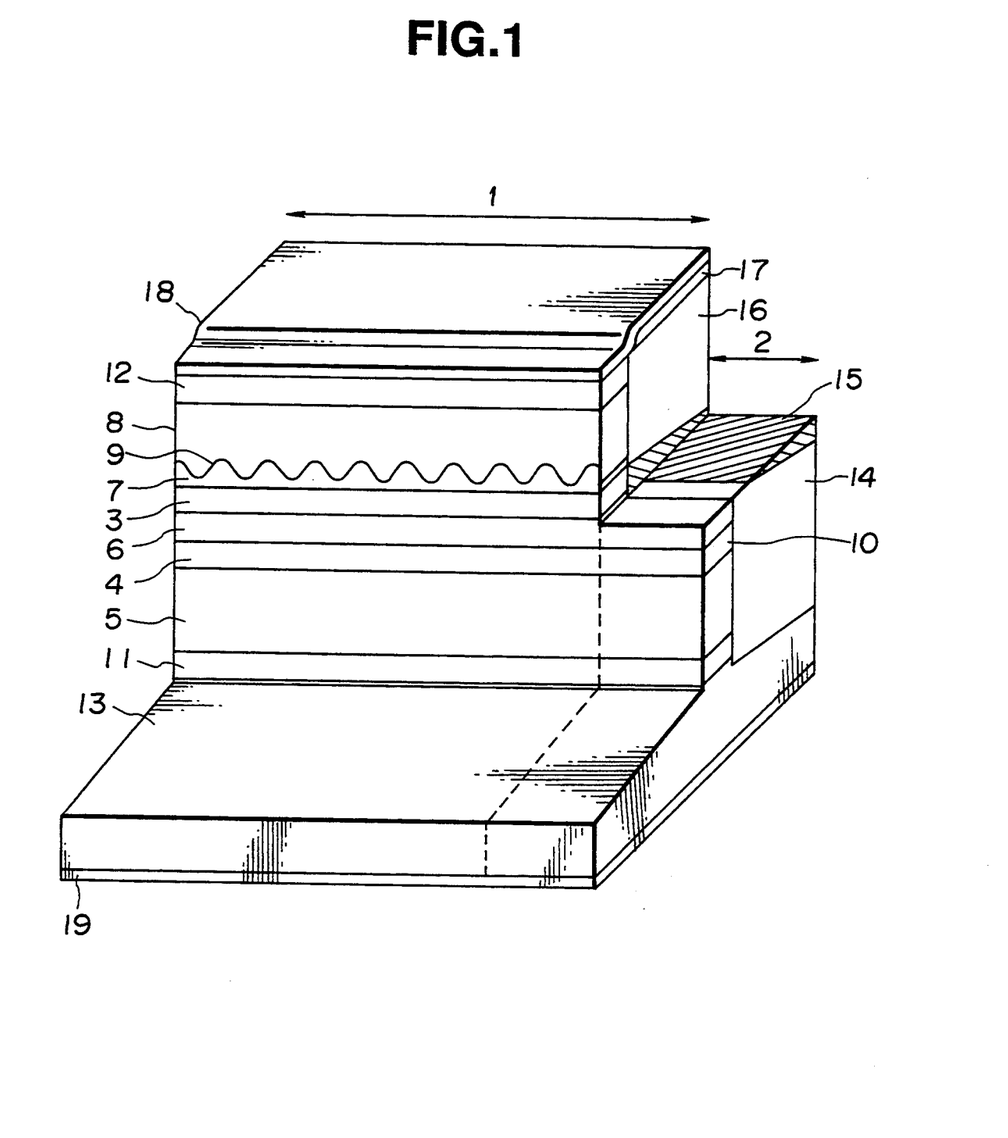
FIG. 1 is a perspective cross-sectional view illustrating a first embodiment of the present invention.

FIG. 1 shows a first embodiment of the present invention. In FIG. 1, a half of a device on this side is cut away for the convenience of easy sight. The operation principle and the structure of the first embodiment will be described first. This embodiment includes a laser cavity portion 1 and a mode selector portion 2.

In the laser cavity portion 1, an active layer 3 and a waveguide layer 4 are formed a distance away from each other in a layering direction. Those layers 3 and 4 are sandwiched by a lower cladding layer 5, an intermediate cladding layer 6, a light guide layer 7 and an upper cladding layer 8 to effect light confinement in a vertical direction. Thus, an asymmmetrical directional coupler structure is built. Refractive indices and layer thicknesses of the active layer 3 and the waveguide layer 4 are different from each other, and those layers 3 and 4 are designed so that two modes of light can be propagated therealong: one being an odd mode which is propagated mainly in the active layer 3 and the other being an even mode which is propagated mainly in the waveguide layer 4. A grating 9 is formed at a location where the even and odd modes propagated in the asymmetrical directional coupler are coupled to each other. In this embodiment, the grating 9 is formed in the light guide layer 7.

In the mode selector portion 2 adjacent to the laser cavity portion 1, a waveguide layer 10 is connected to the waveguide layer 4 in the laser cavity portion 1. On the other hand, in the mode selector portion 2, a layer corresponding to the active layer 3 in the laser cavity portion 1 is removed, so that a mode propagated along the active layer 3 cannot pass through the mode selector portion 2. As to the carrier doping, only the active layer 3 is undoped (intrinsic), and layers above and below the active layer 3 are respectively p-doped and n-doped. Thus a laser structure, into which current can be injected, is produced.

Figure 4:
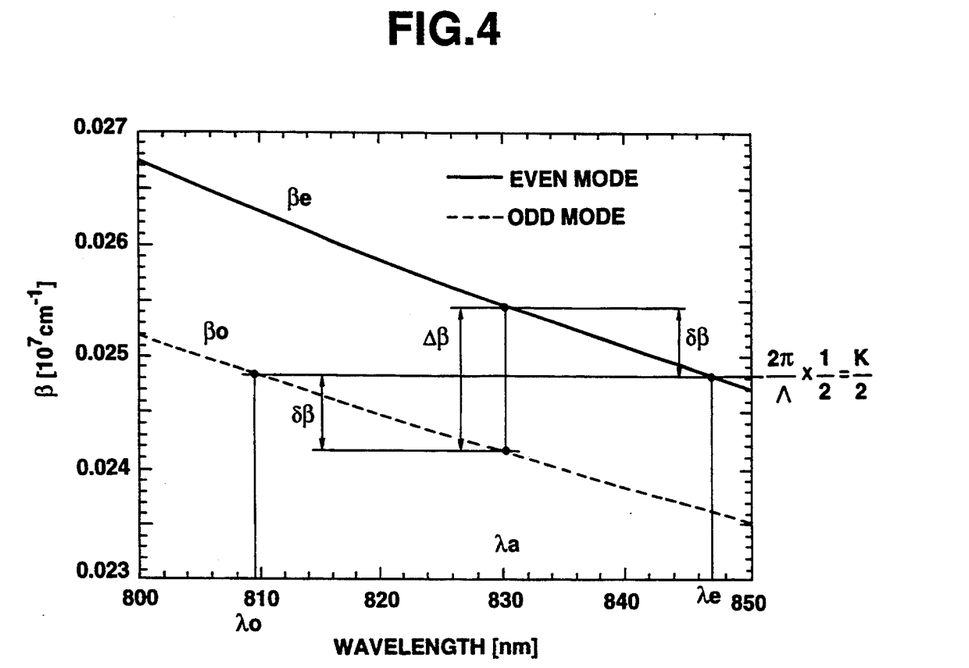
FIG. 4 is a graph illustrating the wavelength dispersion of propagation constants.

The laser oscillation caused by the coupling between even and odd modes will hereinafter be described. In the asymmetrical directional coupler portion in the laser cavity portion 1, propagation constants are respectively represented by $\beta_e(\lambda_a)$ and $\beta_o(\lambda_a)$, when light having a wavelength $\lambda_a$ in vacuum is propagated in the even and odd modes, considering the wavelength dispersion. The wavelength dispersion of propagation constants is illustrated in FIG. 4. Due to the asymmetry between the active layer 3 and the waveguide layer 4, the propagation constant difference of $\Delta\beta = \beta_e(\lambda_a) - \beta_o(\lambda_a)$ has a value that is not negligible, compared with a value of $\beta_e\lambda_a)$. In other words, light waves traveling in the same direction (a minus sign (−) on the right side of that relation indicates this) in even and odd modes are not coupled to each other when no grating is formed.

However, when the pitch $\Lambda$ of the grating 9 has a small value which is approximately equal to the wavelength of light propagated in the waveguide, the coupling between even and odd modes, which travel in opposite directions (a plus sign (+) on the left side of the following relation (4) indicates this), occurs at a wavelength that satisfies relation (4):

$$\beta_e(\lambda_a) + \beta_o(\lambda_a) = 2m\pi/\Lambda \quad (4)$$

where m is a positive integer (1, 2, 3, ...). In an actual designing of the device, after determining the shape of the waveguide, the oscillation wavelength $\lambda_a$ is fixed, and then the propagation constants $\beta_e(\lambda_a)$ and $\beta_o(\lambda_a)$ at this wavelength are obtained and the value of $\Lambda$ on the right side of relation (4) is determined.

Further, on a shorter side of $\lambda_a$, a wavelength $\lambda_o$, that satisfies the following relation (5), exists, and the coupling between odd modes propagated in opposite directions occurs:

$$2 \times \beta_o(\lambda_o) = 2m\pi/\Lambda \quad (5)$$

Furthermore, on a longer side of $\lambda_a$, a wavelength $\lambda_e$, that satisfies the following relation (6), exists, and the coupling between even modes propagated in opposite directions occurs:

$$2 \times \beta_e(\lambda_e) = 2m\pi/\Lambda \quad (6)$$

Figure 3:
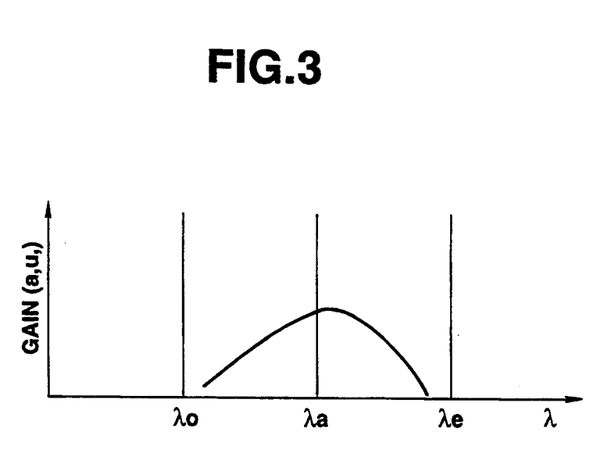
FIG. 3 is a graph illustrating the relationship between the oscillation wavelength and wavelengths of the other resonance modes.

The relationship between the wavelengths $\lambda_e$, $\lambda_a$ and $\lambda_o$ is illustrated in FIG. 3.

The coupling constant between even and odd modes is given by:

$$K_{oe} \simeq \frac{\omega\epsilon_o}{4} E_y^{(even)*}|_{x=x_0} E_y^{(odd)}|_{x=x_0} 2h\Delta\epsilon q \quad (7)$$

Similarly, the coupling constant between even modes is given by:

$$K_{ee} \simeq \frac{\omega \epsilon_o}{4} E_y^{(even)*}|_{x=x_o} E_y^{(even)}|_{x=x_o} 2h\Delta\epsilon_q \qquad (8)$$

Further, the coupling constant between odd modes is given by:

$$K_{oo} \simeq \frac{\omega \epsilon_o}{4} E_y^{(odd)*}|_{x=x_o} E_y^{(odd)}|_{x=x_o} 2h\Delta\epsilon_q \qquad (9)$$

In those relations, 2h represents the depth of the grating 9, $x_o$ represents the location of the grating 9, and $\Delta\epsilon_q$ is a q-th order Fourier component of the dielectric constant, or the amplitude of a wave number that has a component of $K=2\pi q/\Lambda$. Those relations (7), (8) and (9) show that the coupling between those respective modes occurs when the phase matching condition of relation (4), (5) or (6) is satisfied. It is apparent that, in order to increase the coupling between even and odd modes represented by relation (7), the grating 9 needs to be formed at a position where the electric field amplitudes of the even and odd modes are large.

If the oscillation happened in the coupling between even modes (the wavelength $\lambda_e$) or in the coupling between odd modes (the wavelength $\lambda_o$), the oscillation would be performed at the Bragg wavelength of the even or the odd mode. However, when the active layer 3 is designed so that the wavelengths $\lambda_o$ and $\lambda_e$ are shifted away from the gain peak as shown in FIG. 3 and that the gain peak, which appears when current is injected into the active layer 3 up to the oscillation threshold carrier density, comes near to the wavelength $\lambda_a$, the laser oscillation is performed in the coupling between the even and odd modes given by relation (7).

When the laser oscillation is conducted at the wavelength $\lambda_a$ by coupling the even and odd modes that respectively travel in opposite directions, as discussed above, the oscillation mode is degenerate.

Figure 2A:
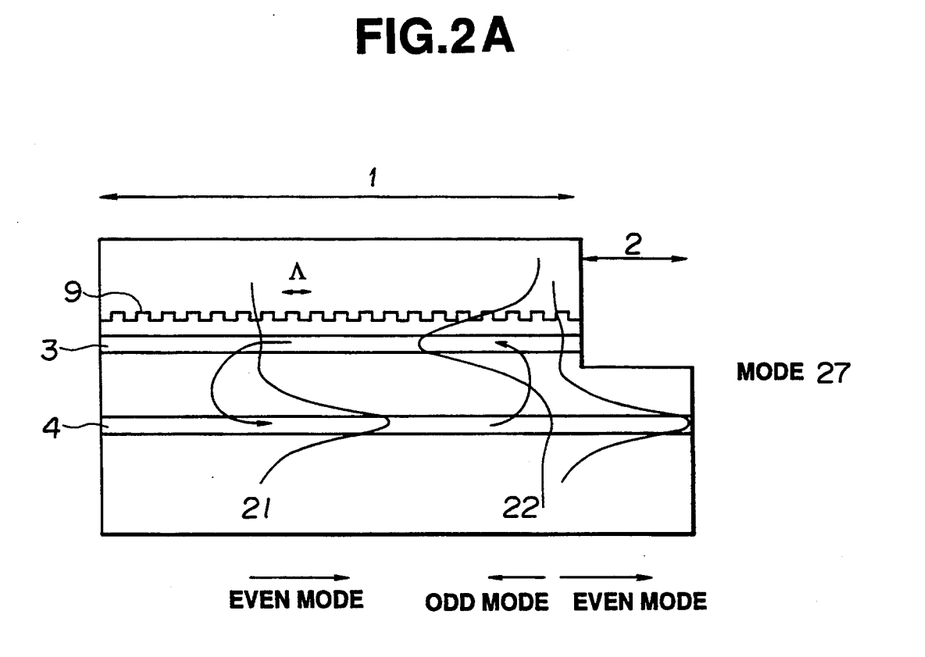
FIGS. 2A and 2B are views respectively illustrating resonance modes established in the first embodiment.
Figure 2B:
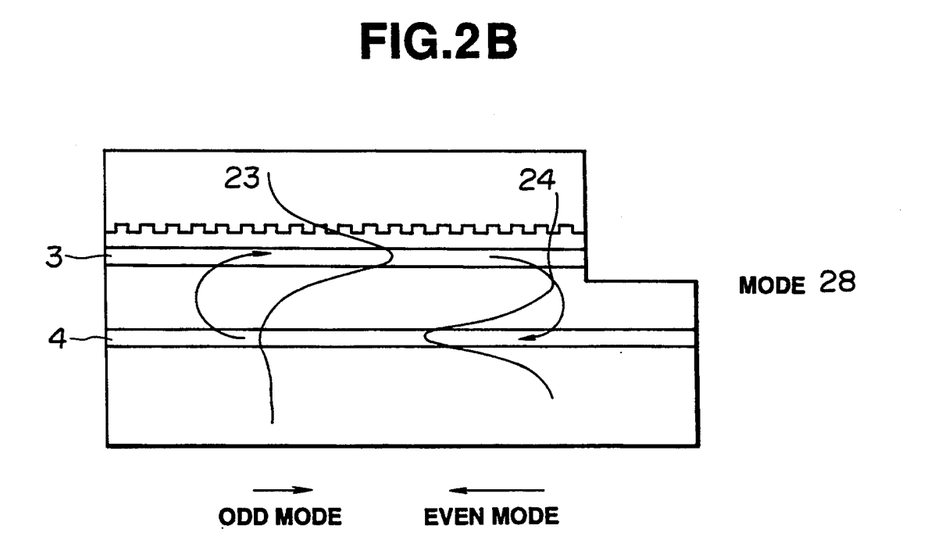

FIGS. 2A and 2B respectively show two degenerate oscillation modes 27 and 28 of the wavelength $\lambda_a$. In the asymmetrical directional coupler that has the grating 9 of a pitch $\Lambda$, light wave 21 in the even mode at the wavelength $\lambda_a$, that travels to the right, and light wave 22 in the odd mode at the same wavelength $\lambda_a$, that travels to the left, are coupled to each other, and thus the longitudinal mode 27 of the laser at the wavelength $\lambda_a$ is produced.

Similarly, light wave 23 in the odd mode at the wavelength $\lambda_a$, that travels to the right, and light wave 24 in the even mode at the wavelength $\lambda_a$, that travels to the left, are coupled to each other, and thus the longitudinal mode 28 of the laser at the same wavelength $\lambda_a$ is created.

Between the two longitudinal modes 27 and 28, there is no coupling through the grating 9. That fact will be described referring to two waveguide modes which constitute the longitudinal mode 27: one is the even mode 21 that travels to the right and the other is the odd mode 22 that travels to the left.

Initially, the light wave in the even mode 21 at the wavelength $\lambda_a$, that travels to the right, would not be coupled to the odd mode 23 that also travels to the right, because their propagation constants are different from each other and the wave number of the grating 9 is too large as compared to this propagation constant difference. The coupling between the even mode 21, that travels to the right, and the even mode 24, that travels to the left, gives rise to a Bragg wavelength at the wavelength and hence this coupling is a coupling that is detuned from the Bragg wavelength by the following magnitude, for light of the wavelength $\lambda_a$:

$$\delta\beta = \beta_e(\lambda_a) - \beta_e(\lambda_e) \qquad (10)$$

The wavelengths $\lambda_a$ and $\lambda_e$ are remote from each other by approximately a half-width of the gain peak in the vicinity of threshold (see FIG. 3), and this coupling can be disregarded since phase matching cannot be attained.

Next, the light wave in the odd mode 22 at the wavelength $\lambda_a$, that travels to the left, is not coupled to the even mode 24 that also travels to the left, because their propagation constants are different from each other and the wave number of the grating 9 is sufficiently great, as compared to this propagation constant difference. The coupling between the odd mode 22, that travels to the left, and the odd mode 23, that travels to the right, gives rise to a Bragg wavelength at the wavelength $\lambda_o$, and hence this coupling is a coupling that is detuned from the Bragg wavelength by the following magnitude, for light of the wavelength $\lambda_a$:

$$\delta\beta = \beta_o(\lambda_o) - \beta_o(\lambda_a) \qquad (11)$$

Also is this case, the wavelengths $\lambda_o$ and $\lambda_a$ are remote from each other by approximately a half-width of the gain peak in the vicinity of threshold, and this coupling can also be disregarded since the phase matching cannot be achieved.

Antireflection coatings are respectively provided on respective end facets so that no coupling occurs between those two longitudinal modes 27 and 28 through the reflection at each of the end facets. An inactive absorption region may be formed, or the end facet may be formed at a slanting angle relative to a perpendicular surface of the waveguide, in order to attain the same effect, insofar as the mode coupling through the end facet reflection can be prohibited. Furthermore, in order to suppress the influence of the end facet reflection, the laser cavity region may be extended to confine light within the cavity.

The function of the mode selector portion 2 will be described. The mode selector portion 2 is made in the following manner:

Out of the modes propagated in the waveguide of the laser cavity from left to right, a mode that can travel in the mode selector portion 2 is only the even mode 21, and a mode, that travels from right to left in the mode selector portion 2, is coupled only to the even mode 24 that travels from right to left, out of the modes which are propagated in the laser cavity portion 1. In the first embodiment, the light wave in the odd mode 23, that travels from left to right, is not propagated through the mode selector portion 2, and only radiates into the air. However, the active layer 3 in the laser cavity portion 1 may also remain in the mode selector portion 2 as an absorptive region.

Furthermore, it is also effective that the end facet of the active layer 3 is slanted relative to the perpendicular surface of the waveguide. The output light taken out of the thus-constructed mode selector portion 2 is coupled only to the mode 27 of the degenerate oscillation modes in the laser cavity portion 1. Returning light incident on the mode selector portion 2 and light reflected by the emission end facet of the mode selector portion 2 are coupled only to the mode 28 of the degenerate oscillation modes in the laser cavity portion 1.

Thus, the returning light and the light reflected by the end facet are not coupled to the output resonance mode 27, so that an external resonator cannot be established. As a result, in a thus-fabricated semiconductor laser, the intensity noise due to the mode hopping between the external resonator longitudinal modes will not be increased, and the laser is suitable for use in optical communications.

The semiconductor laser of the first embodiment will be fabricated in the following manner.

On an $n^+$-GaAs substrate 13, using molecular beam epitaxy (MBE) or metal organic-chemical vapor deposition (MOCVD), are formed an n-GaAs buffer layer 11 having a thickness of 0.5 $\mu$m and a carrier concentration $n=2\times10^{18}$ cm$^{-3}$, an n-type cladding layer 5 of $Al_{0.5}Ga_{0.5}As$ having a thickness of 1.5 $\mu$m and a carrier concentration $n=1\times10^{17}$ cm$^{-3}$, an n-type waveguide layer 4 of $Al_{0.35}Ga_{0.65}As$ having a thickness of 0.08 $\mu$m and a carrier concentration $n=1\times10^{17}$ cm$^{-3}$, an n-type cladding layer 6 of $Al_{0.5}Ga_{0.5}As$ having a thickness of 0.8 $\mu$m and a carrier concentration $n=1\times10^{17}$ cm$^{-3}$, an undoped i-GaAs active layer 3 of GaAs having a thickness of 0.1 $\mu$m, and a p-type $Al_{0.2}Ga_{0.8}As$ grating or light guide layer 7 having a thickness of 0.2 $\mu$m and a carrier concentration $p=1\times10^{17}$ cm$^{-3}$.

Then, only in the laser cavity portion 1, the grating 9 having a pitch of 0.125 $\mu$m is formed on the grating layer 7 by lithography using an interference exposure method. Furthermore, using MOCVD, there are formed a p-type cladding layer 8 of $Al_{0.5}Ga_{0.5}As$ having a thickness of 1.5 $\mu$m and a carrier concentration $p=1\times10^{17}$ cm$^{-3}$, a p-type GaAs contact layer 12 having a thickness of 0.5 $\mu$m and a carrier concentration $p=5\times10^{18}$ cm$^{-3}$.

Next, a stripe mask is formed in a direction perpendicular to the grating 9, and etching is conducted down to the GaAs substrate 13. After removal of the stripe mask, a p-$Al_{0.5}Ga_{0.5}As$ layer 14, an undoped i-$Al_{0.5}Ga_{0.5}As$ layer 15 (a hatched portion), and an n-$Al_{0.5}Ga_{0.5}As$ layer 16 are regrown in this order, and a transverse or lateral light confinement structure having a buried structure is formed. Then, etching is conducted down to the cladding layer 6 in the mode selector portion 2 after the laser cavity portion 1 is protected by using a resist mask.

Then, a protective layer 17 of $Si_3N_4$ is deposited on overall wafer by a plasma CVD method, and an electrode 18 is deposited in the laser cavity portion 1 after removing the $Si_3N_4$ layer on the stripe. After lapping the bottom surface of the substrate 13, a bottom electrode 19 is deposited thereon. Ohmic contact between the electrodes 18 and 19 and the p-contact layer 12 and the $n^+$-substrate 13 is formed by alloying. Finally, the substrate 13 is cleaved so that the length of the laser cavity portion 1 amounts to 500 $\mu$m and the length of the mode selector portion 2 amounts to 200 $\mu$m. After antireflection coatings are provided on the emission end facet of the mode selector portion 2 and on the both opposite end facets of the laser cavity portion 1, the wafer is packaged so that carrier can be injected across the bottom electrode 19 and the top electrode 18. Thus, a single wavelength semiconductor laser can be fabricated, in which a stable single wavelength of 830 nm is oscillated and no mode hopping occurs under the condition that the amount of the returning light is less than 1%.

Second Embodiment

Figure 5:
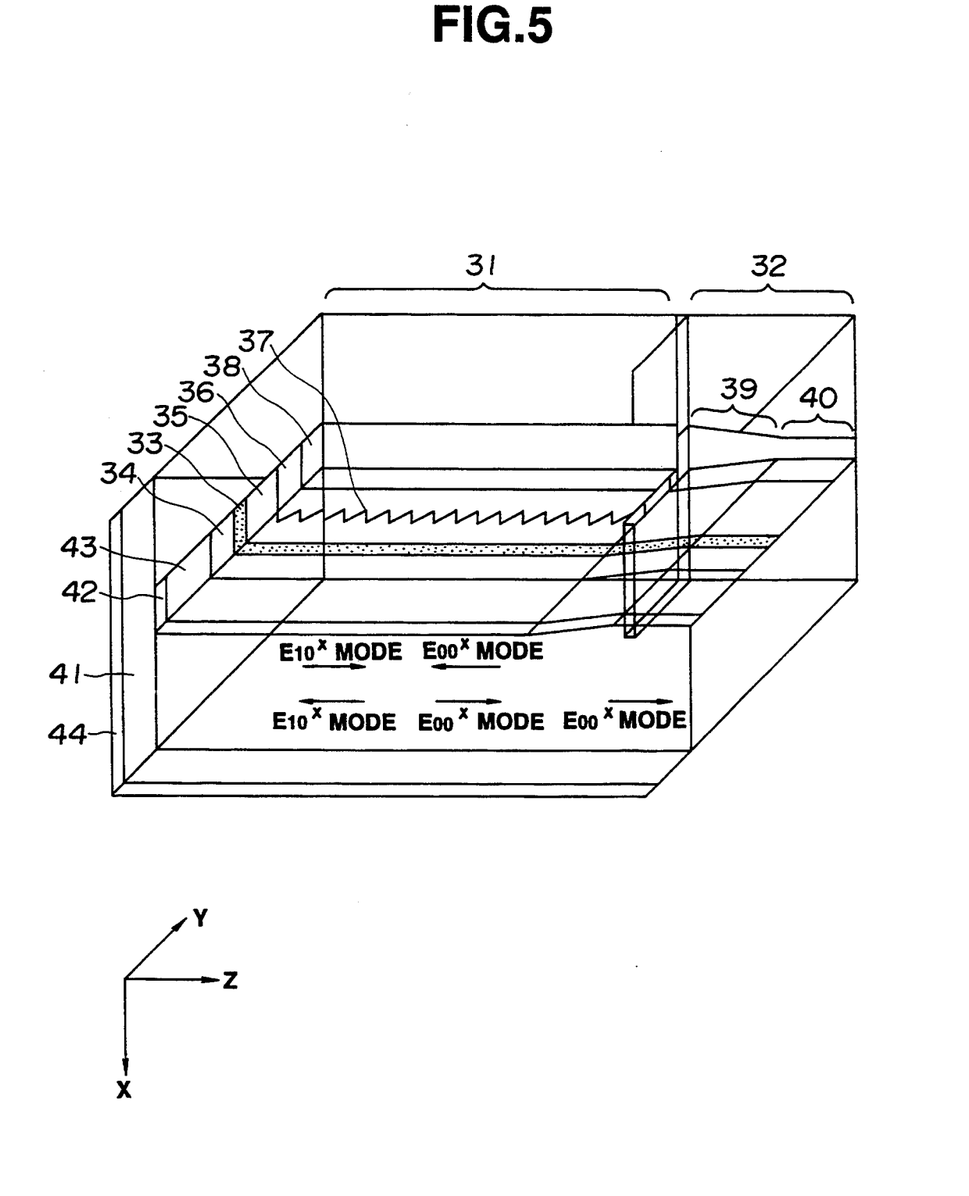
FIG. 5 is a perspective view illustrating a second embodiment of the present invention.

FIG. 5 shows a second embodiment of the present invention. In FIG. 5, a top perspective view is shown and layers, such as a burying layer for performing a transverse confinement, are depicted as transparent. The second embodiment also includes a laser cavity portion 31 and a mode selector portion 32, similar to the first embodiment.

Figure 6A:
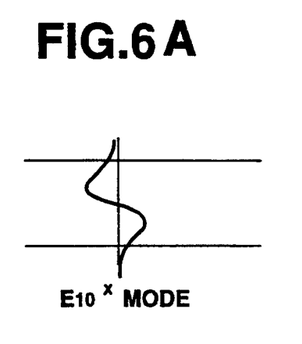
FIGS. 6A and 6B are views respectively illustrating propagation modes of the second embodiment.
Figure 6B:
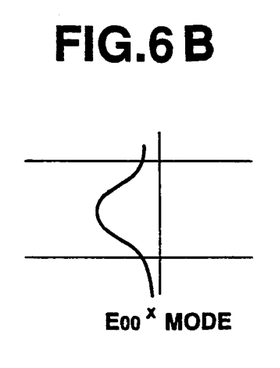

In the laser cavity portion 31, an active layer 33 of a single quantum well is sandwiched by light confinement layers 34 and 35 so that a separate confinement structure is built. The active layer 33 is also put between cladding layers 43 and 36 to form a light waveguide structure in a layer thickness or vertical direction. As a light confinement structure in a transverse direction, the buried structure of a ridge 38 is used to build a multimode waveguide structure. As a transverse mode in a horizontal direction parallel to a substrate 41 $E_{00}{}^x$ and $E_{10}{}^x$ modes as shown in FIGS. 6A and 6B can be propagated along the waveguide structure. The ridge width is approximately set to a cutoff of $E_{00}{}^x$ mode of light at a wavelength $\lambda_a$, so that the propagation constant of the $E_{00}{}^x$ mode of light at the wavelength $\lambda_a$ is relatively greatly different from that of the $E_{10}{}^x$ mode of light at the wavelength $\lambda_a$. A grating 37 is formed at a position coupled to the waveguide (on the light confinement layer 35 in the second embodiment).

In the mode selector portion 32 adjacent to the laser cavity portion 31, there is arranged a portion which is connected to the ridge 38 and whose waveguide ridge width is tapered, and a waveguide portion 40 connected to the tapering portion 39. The waveguide portion 40 is a single mode waveguide structure that propagates only the $E_{00}{}^x$ mode for light at the wavelength $\lambda_a$. As to the carrier doping, only the active layer 33 of the single quantum well structure is undoped (intrinsic), and layers above and below the active layer 33 are respectively p-doped and n-doped, in both the laser cavity portion 31 and the mode selector portion 32. Thus a laser structure, into which current can be injected, is produced.

Couplings between $E_{00}{}^x$ and $E_{10}{}^x$ modes which travel in opposite directions (two couplings exist as illustrated in FIG. 5) are brought about by the grating 37, and they become two oscillation or resonance modes at an oscillation wavelength, similar to the first embodiment. In the first embodiment, the waveguide layer in the mode selector portion 2 propagates light that has a wavelength longer than the wavelength of its band gap, so that there is no need to consider absorption loss in the mode selector portion 2. In the second embodiment, however, the waveguide layer in the mode selector portion 32 has the same composition as the active layer 33 of the laser cavity portion 31, and therefore absorption loss becomes serious if no countermeasure therefor is provided. Hence, current injection is conducted also in the mode selector portion 32, and thus the absorption loss is compensated for by the gain in the waveguide.

Also in the second embodiment, returning light, which has the leftward travelling $E_{00}{}^x$ mode when entering the laser cavity portion 31 since the waveguide portion 40 is the single mode waveguide structure as discussed above, would not be coupled to the oscillation or resonance mode of the output which is constituted by the rightward travelling $E_{00}{}^x$ mode and the leftward travelling $E_{10}{}^x$ mode. Therefore, no external resonator would be established. As a result, in a thus-formed semiconductor laser, the intensity noise due to the mode hopping between the external resonator longitudinal modes will not be increased, and the laser is suitable for use in optical communications.

The semiconductor laser of the second embodiment is fabricated in the following manner.

On an n+-GaAs substrate 41, are formed an n-GaAs buffer layer 42 having a thickness of 0.5 μm and a carrier concentration n=2×10$^{18}$ cm$^{-3}$, an n-type cladding layer 43 of Al$_{0.4}$Ga$_{0.6}$As having a thickness of 1.5 μm and a carrier concentration n=1×10$^{17}$ cm$^{-3}$, an n-type light confinement layer 34 of Al$_{0.2}$Ga$_{0.8}$As having a thickness of 0.25 μm and a carrier concentration n=1×10$^{16}$ cm$^{-3}$, a single well active layer 33 consisting of an intrinsic (undoped) Al$_{0.2}$Ga$_{0.8}$As barrier layer having a thickness of 0.05 μm, an intrinsic (undoped) GaAs well layer having a thickness of 0.006 μm and an intrinsic (undoped) Al$_{0.2}$Ga$_{0.8}$As barrier layer having a thickness of 0.05 μm, and a p-type light confinement layer 35 of Al$_{0.2}$Ga$_{0.8}$As having a thickness of 0.25 μm and a carrier concentration p=1×10$^{16}$ cm$^{-3}$.

Then, only in the laser cavity portion 31, a grating 37 having a pitch of 0.1258 μm is formed by lithography using an interference exposure method. Furthermore, there are formed a p-type cladding layer 36 of Al$_{0.4}$Ga$_{0.6}$As having a thickness of 1.5 μm and a carrier concentration p=1×10$^{17}$ cm$^{-3}$, and a p-type GaAs contact layer 38 having a thickness of 0.5 μm and a carrier concentration p=5×10$^{18}$ cm$^{-3}$.

Next, a stripe mask is formed in a direction perpendicular to the grating 37, and etching is conducted down to the GaAs substrate 41. After removal of the stripe mask, a p-Al$_{0.7}$Ga$_{0.3}$As layer, an undoped i-Al$_{0.7}$Ga$_{0.3}$As layer, and an n-Al$_{0.7}$Ga$_{0.3}$As layer are regrown in this order, and thus a transverse light confinement structure having a buried structure is formed.

Then, a protective layer of Si$_3$N$_4$ (not shown) is deposited on overall wafer by plasma CVD method, and an electrode (not shown) is deposited in the laser cavity portion 31 and the mode selector portion 32 after removing the Si$_3$N$_4$ layer on the stripe. After lapping the bottom surface of the substrate 41, a bottom electrode 44 is deposited. Ohmic contact between the electrodes and the p-contact layer 38 and n+-substrate 41 is achieved by alloying. Finally, the substrate 41 is cleaved so that the length of the laser cavity portion 31 amounts to 500 μm and the length of the mode selector portion 32 amounts to 800 μm. After antireflection coatings are provided on the emission end face of the mode selector portion 32 and on the both opposite end facets of the laser cavity portion 31, the wafer is packaged so that carrier can be injected across the bottom electrode 44 and the top electrode in the laser cavity portion 31 and the mode selector portion 32.

When the ridge width of the active layer portion is set at 0.3 μm, the equivalent refractive index of the E$_{00}^x$ mode is 3.404 for light of 830 nm and the equivalent refractive index of the E$_{10}^x$ mode is 3.193 for light of 830 nm. Here, the E$_{00}^x$ and E$_{10}^x$ modes are coupled to each other by the grating 37 having a pitch of 0.1258 μm, and the oscillation wavelength becomes 830 nm. On the other hand, the Bragg wavelength of the grating 37 having a pitch of 0.1258 μm for the E$_{00}^x$ mode is 850 nm, and the Bragg wavelength of the grating 37 having a pitch of 0.1258 μm for the E$_{10}^x$ mode is 808 nm. Those Bragg wavelengths are both remote from the gain peak, so that those modes would not be a laser oscillation mode.

Third Embodiment

Figure 7:
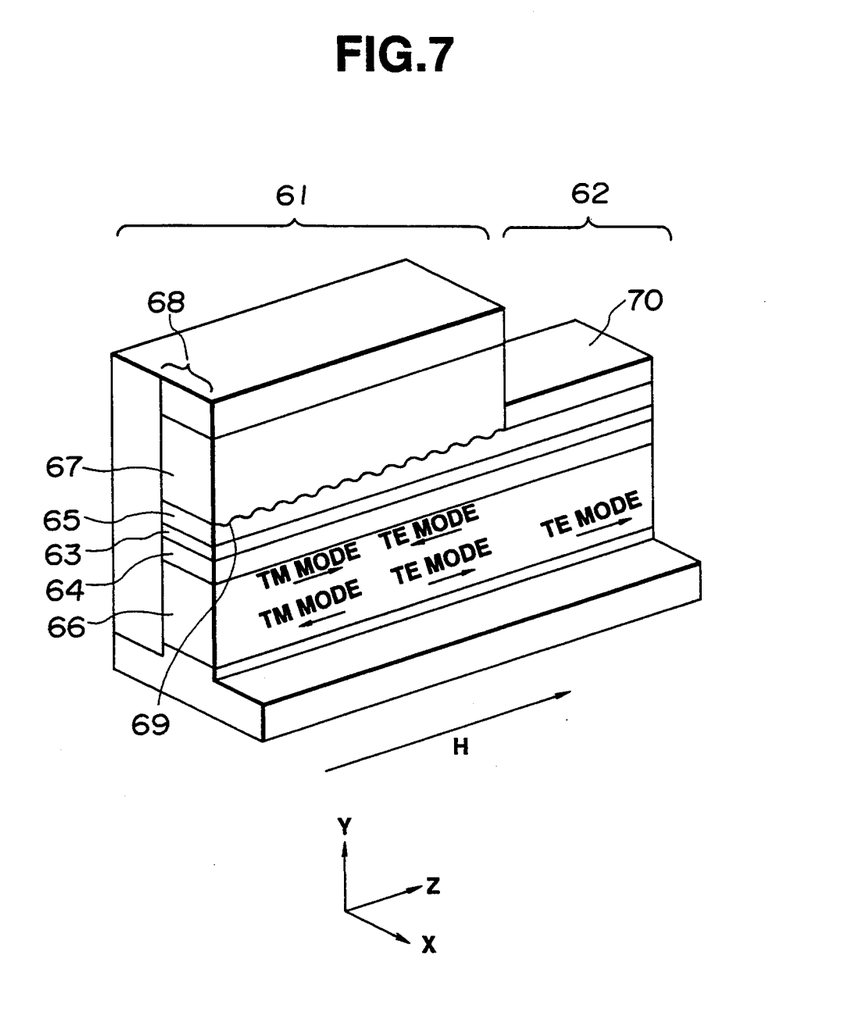
FIG. 7 is a perspective view illustrating a third embodiment of the present invention.

FIG. 7 shows a third embodiment of the present invention. In FIG. 7, a half portion of the device on the side nearer the observer is cut away for the sake of easy perspective.

The third embodiment also includes a laser cavity portion 61 and a mode selector portion 62, similar to the first and second embodiments. Technical terms of transverse electric (TE) mode and transverse magnetic (TM) mode can be correctly used, strictly speaking, only in the case of a slab waveguide which infinitely extends and can be treated as a two-dimensional plane. In the following, however, a mode $E_{pq}^x$, whose principal electric field component lies in a plane of a thin film, is named a TE mode and a mode $E_{pq}^y$, whose principal electric field component lies in a plane perpendicular to the thin film, is named a TM mode.

In the laser cavity portion 61, an active layer 63 of a GaAs/AlGaAs multiple quantum well structure is sandwiched by light confinement layers 64 and 65 of AlGaAs so that a separate confinement heterostructure is built. The active layer 63 is further put between an AlGaAs cladding layer 66 and a CdMnTe cladding layer 67 to form a light waveguide structure in a layer thickness direction. As a light confinement structure in a transverse direction, the buried structure of a ridge 68 is used to build a waveguide structure through which TE and TM modes can be propagated as shown in FIG. 7. The multiple quantum well structure is used as the active layer 63, so that the propagation constant of the TE mode is greatly different from that of the TM mode. The cladding layer 67 is composed of a magnetic semiconductor of CdMnTe, so that the coupling between TE and TM modes can be caused, accompanied with the mode conversion therebetween, by the application of a magnetic field H in a waveguide direction (a magnetooptic effect). A grating 69 is formed on the light confinement layer 65, and the coupling between TE and TM modes is periodically perturbed in its magnitude.

In the mode selector portion 62 adjacent to the laser cavity portion 61, a metal cladding film 70 is formed in place of the magnetic semiconductor of the cladding layer 67 in the laser cavity portion 61. The metal cladding film 70 selectively imparts a large loss to the TM mode, and the mode selector portion 62 can transmit only the TE mode therethrough. As to the carrier doping in the laser cavity portion 61, only the active layer 63 of the multiple quantum well structure is undoped (intrinsic), and layers above and below the active layer 63 are respectively p-doped and n-doped. Thus, a laser structure, into which current can be injected, is produced.

Also, in the third embodiment, couplings between TE mode and TM mode which travel in opposite directions (two couplings exist as illustrated in FIG. 7: one is between the rightward travelling TM mode and the leftward travelling TE mode, and the other is between the rightward travelling TE mode and the leftward travelling TM mode) are effected by the grating 69, and they become oscillation or resonance modes at the oscillation wavelength, similar to the first and second embodiments. Also in the third embodiment, the laser oscillation, whose mode is the TE mode, travelling in the right direction, of one oscillation mode, is picked out from those modes by the mode selector portion 62.

The principle of coupling the TE and TM modes is not limited to the above-discussed magnetooptic effect.

An electrooptic effect or an effect due to strain in the active layer 63 may be utilized. Furthermore, the mode selector is not limited to the metal cladding film 70.

Also, in the third embodiment, returning light, which is the leftward travelling TE mode when entering the laser cavity portion 61, would not be coupled to the oscillation or resonance mode of the output which is constituted by the rightward travelling TE mode and the leftward travelling TM mode. Therefore, no external resonator would be established. The same effects as those of the above embodiments can be obtained.

In the above-described embodiments, only a short wavelength laser of GaAs series is shown, but the principle of the present invention can also be apllied to a 1.3 μm-band laser of InP series, a 1.5 μm-band laser of InP series and so forth.

As described in the foregoing, according to the present invention, the laser oscillation is caused by coupling modes having different propagation constants and selecting a specific mode as an output mode. Therefore, a laser of the present invention is insensitive to returning light. Thus, a single wavelength semiconductor laser which requires no isolator can be provided.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A single wavelength semiconductor laser comprising:
   laser cavity means, said laser cavity means including a waveguide and perturbation means for imparting a periodical perturbation to said waveguide, and said laser cavity means functioning as a mode selecting reflective mirror for coupling two modes, which have different absolute values of propagation constants, to each other, accompanied with a mode conversion, said two coupled modes respectively travelling forward and rearward along said waveguide to constitute two degenerate laser resonance modes; and
   mode selector means for selectively outputting a predetermined laser resonance mode as one of the two degenerate laser resonance modes, said mode selector means being structured so that light returning to said semiconductor laser from outside can be coupled only to the other of the two degenerate laser resonance modes.

2. A single wavelength semiconductor laser according to claim 1, wherein said laser cavity means includes loss means for suppressing the mode conversion in which the absolute value of the propagation constant remains unchanged and the sign thereof is inverted.

3. A single wavelength semiconductor laser according to claim 2, wherein said loss means comprises an absorptive region provided adjacent to or in said laser cavity means.

4. A single wavelength semiconductor laser according to claim 2, wherein said loss means comprises an antireflection coating provided on an end face of said laser.

5. A single wavelength semiconductor laser according to claim 2, wherein said loss means comprises an end face of said laser formed slantingly relative to a direction perpendicular to said waveguide.

6. A single wavelength semiconductor laser according to claim 1, wherein two waveguides are arranged to constitute an asymmetrical directional coupler, and the two modes are even and odd modes which are propagated through said asymmetrical directional coupler.

7. A single wavelength semiconductor laser according to claim 1, wherein said mode selector means comprises separator means for spatially separating the two laser resonance modes and taking out one of the two laser resonance modes.

8. A single wavelength semiconductor laser according to claim 7, wherein two waveguides are arranged to constitute an asymmetrical directional coupler, the two modes are even and odd modes which are propagated through said asymmetrical directional coupler, and said mode selector means comprises a waveguide which is connected to and extends from one of said two waveguides of said asymmetrical directional coupler.

9. A single wavelength semiconductor laser according to claim 1, wherein said waveguide comprises a multimode waveguide and the two modes are 0-th order transverse mode and first-order transverse mode which are propagated through said multimode waveguide.

10. A single wavelength semiconductor laser according to claim 9, wherein said mode selector means comprises a single mode waveguide having a predetermined cutoff.

11. A single wavelength semiconductor laser according to claim 1, wherein the two modes are transverse electric (TE) and transverse magnetic (TM) modes whose principal directions of electric fields are different from each other.

12. A single wavelength semiconductor laser according to claim 11, wherein said mode selector means comprises selective loss means for selectively imparting loss to one of the TE and TM modes.

13. A single wavelength semiconductor laser according to claim 12, wherein said mode selector means comprises a metal film.

14. A single wavelength semiconductor laser according to claim 11, wherein said laser cavity means comprises a magnetic semiconductor layer formed along said waveguide.

15. A single wavelength semiconductor laser according to claim 1, wherein said perturbation means comprises a grating formed along said waveguide.

16. A single wavelength semiconductor laser according to claim 1, wherein said mode selector means comprises an electrode for injecting current into said mode selector means.

17. A single wavelength semiconductor laser comprising:
   laser cavity means, said laser cavity means including a multimode waveguide through which a plurality of transverse modes having different absolute values of propagation constants can be propagated, and means for imparting a periodical perturbation to said waveguide, so that the transverse modes can be coupled to each other when light of a predetermined wavelength is propagated in said waveguide, the two coupled transverse modes travelling forward and rearward along said waveguide to constitute two degenerate laser resonance modes; and
   mode selector means for selectively outputting a predetermined laser resonance mode as one of the two degenerate laser resonance modes, said mode selector means being structured so that light returning to said semiconductor laser from outside can be coupled only to the other of the two degenerate laser resonance modes.

18. A single wavelength semiconductor laser comprising:
   laser cavity means, said laser cavity means including a waveguide, and means for imparting a periodical perturbation to said waveguide so that transverse electric (TE) and transverse magnetic (TM) modes having different absolute values of propagation constants can be coupled to each other, accompanied with a mode conversion, when light of a predetermined wavelength is propagated in said waveguide, the coupled TE and TM modes travelling forward and rearward to constitute two degenerate laser resonance modes; and
   mode selector means for selectively outputting a predetermined laser resonance mode as one of the two degenerate laser resonance modes, said mode selector means being structured so that light returning to said semiconductor laser from outside can be coupled only to the other of the two degenerate laser resonance modes.

19. A single wavelength semiconductor laser comprising:
   laser cavity means, said laser cavity means including a waveguide and means for imparting a perturbation to said waveguide, so that two kinds of modes having different absolute values of propagation constants can be coupled to each other when light of a predetermined wavelength is propagated in said waveguide, the coupled modes respectively travelling in opposite directions to constitute two degenerate laser resonance modes; and
   mode selector means for selectively outputting a predetermined laser resonance mode as one of the two degenerate laser resonance modes, said mode selector means being structured so that light returning to said semiconductor laser from outside can be coupled only to the other of the two degenerate laser resonance modes.

20. A single wavelength semiconductor laser comprising:
   laser cavity means, said laser cavity means including a waveguide and means for imparting a perturbation to said waveguide, so that first and second modes having different absolute values of propagation constants can be coupled to each other when light of a predetermined wavelength is propagated in said waveguide, the coupled first and second modes respectively travelling in opposite first and second directions to constitute first and second laser resonance modes, the first laser resonance mode consisting of the first mode travelling in the first direction and the second mode travelling in the second direction, and second laser resonance mode consisting of the first mode travelling in the second direction and the second mode travelling in the first direction; and
   mode selector means for selectively outputting the first mode travelling in the first direction, said mode selector means being structured so that light returning to said semiconductor laser from outside can be coupled only to the the first mode travelling in the second direction.

* * * * *

UNITED STATES PATENT AND TRADEMARK OFFICE
CERTIFICATE OF CORRECTION

PATENT NO. : 5,444,730  
DATED : August 22, 1995  
INVENTOR(S) : Natsuhiko Mizutani Page 1 of 2

It is certified that error appears in the above-indentified patent and that said Letters Patent is hereby corrected as shown below:

ON TITLE PAGE

In [56] References Cited, under U.S. PATENT DOCUMENTS:
        "Rarmire et al." should read --Garmire et al.--.

In [56] References Cited, under OTHER PUBLICATIONS:
        "OE-16," should read --QE-16,--.

COLUMN 1

Line 56, "Kohzoh" should read --Kohroh--.

COLUMN 2

Line 1, "$\kappa$" should read --$\Gamma$--.

COLUMN 3

Line 23, "modes" should read --modes,--.

COLUMN 4

Line 44, "comprise" should read --comprises--.
    Line 59, "imaginary of" should read --imaginary number of--.

UNITED STATES PATENT AND TRADEMARK OFFICE
CERTIFICATE OF CORRECTION

PATENT NO. : 5,444,730
DATED : August 22, 1995
INVENTOR(S) : Natsuhiko Mizutani

It is certified that error appears in the above-indentified patent and that said Letters Patent is hereby corrected as shown below:

COLUMN 13

Line 14, "apllied" should read --applied--.

Signed and Sealed this

Ninth Day of January, 1996

Attest:

BRUCE LEHMAN

Attesting Officer

Commissioner of Patents and Trademarks